US00RE37716E

(19) United States
(12) Reissued Patent
Sutardja et al.

(10) Patent Number: US RE37,716 E
(45) Date of Reissued Patent: May 28, 2002

(54) HIGH-SPEED, LOW POWER, MEDIUM RESOLUTION ANALOG-TO-DIGITAL CONVERTER AND METHOD OF STABILIZATION

(75) Inventors: Sehat Sutardja, Cupertino; Pantas Sutardja, San Jose, both of CA (US)

(73) Assignee: Marvell International, Ltd., Hamilton (BM)

(21) Appl. No.: 09/760,705

(22) Filed: Jan. 17, 2001

Related U.S. Patent Documents

Reissue of:
(64) Patent No.: 5,861,829
Issued: Jan. 19, 1999
Appl. No.: 08/847,912
Filed: Apr. 28, 1997

(51) Int. Cl.[7] ..... H03M 1/10; H03M 1/12
(52) U.S. Cl. ..... 341/120; 341/155; 341/118; 341/159; 341/122
(58) Field of Search ..... 341/120, 118, 341/155, 119, 121, 154, 159, 172, 156, 122

(56) References Cited

U.S. PATENT DOCUMENTS

| | | | | | |
|---|---|---|---|---|---|
| 4,523,180 | A | | 6/1985 | Kuboki et al. | 340/347 |
| 4,617,549 | A | * | 10/1986 | Reiner | 341/159 |
| 4,748,440 | A | | 5/1988 | Kobayashi | 340/347 |
| 4,774,498 | A | | 9/1988 | Traa | 341/159 |
| 4,816,831 | A | * | 3/1989 | Mitzoguchi et al. | 341/156 |
| 4,857,931 | A | * | 8/1989 | Gulcynski | 341/156 |
| 4,928,102 | A | * | 5/1990 | Katzenstein | 341/154 |
| 4,999,630 | A | * | 3/1991 | Masson | 341/120 |
| 5,041,832 | A | * | 8/1991 | Gulcynski | 341/159 |
| 5,093,664 | A | | 3/1992 | Senn et al. | 341/156 |
| 5,294,926 | A | * | 3/1994 | Concoran | 341/120 |
| 5,349,354 | A | * | 9/1994 | Ito et al. | 341/156 |
| 5,416,485 | A | * | 5/1995 | Lee | 341/172 |
| 5,500,644 | A | * | 3/1996 | Denjean et al. | 341/120 |
| 5,600,322 | A | * | 2/1997 | Garavan | 341/172 |
| 5,682,163 | A | | 10/1997 | Hsu | 341/156 |
| 5,784,016 | A | | 7/1998 | Nagaraj | 341/120 |
| 5,825,316 | A | | 10/1998 | Kuttner | 341/120 |

* cited by examiner

*Primary Examiner*—Peguy Jeanpierre
*Assistant Examiner*—Jean Bruner Jeanglaude
(74) *Attorney, Agent, or Firm*—Eric B. Janofsky

(57) ABSTRACT

A full flash analog to digital converter operates on an input voltage with a track/hold circuit coupled to a reference input of each of multiple comparators. Particular track/hold circuits are activated in sequence through a track/hold select circuit, and a look-up table and a digital-to-analog converter are coupled to supply corrected reference voltages to each track/hold circuit. Outputs of the comparators are supplied to a decoder which produces the digital output representative of the input voltage. The converter is calibrated before it is used for conversion by sensing the input offset voltages of each of the comparators and by altering the reference voltage for each comparator to produce a calibrated reference voltage for each comparator. A digital representation of the calibrated reference voltage for each comparator is stored in a look-up table for retrieval as needed to supply to a particular track/hold circuit a corresponding calibrated analog reference voltage for a particular comparator. Digital representations in the look-up table may indicate switch settings required to provide corrected reference voltages, or may indicate the required corrected reference voltage that is supplied by digital to analog converter which converts the digital representation into an analog corrected reference voltage that is held by the track/hold circuit. In this manner, each track/hold circuit is loaded with its respective calibrated reference voltage. An input signal applied to each comparator triggers such comparators upon parity between the corrected reference voltage and input voltage, and all comparator outputs are supplied to a decoder which produces a digital representation of the input signal. Occasionally, the entries in the look-up table and each track/hold circuit may be refreshed or updated in order to compensate for drift of the calibrated reference voltage.

40 Claims, 4 Drawing Sheets

HIGH-SPEED, LOW POWER, MEDIUM RESOLUTION ANALOG-TO-DIGITAL CONVERTER AND METHOD OF STABILIZATION

Matter enclosed in heavy brackets [ ] appears in the original patent but forms no part of this reissue specification; matter printed in italics indicates the additions made by reissue.

FIELD OF INVENTION

This invention pertains in general to analog-to-digital converters and in particular to analog-to-digital converters having a very high operating clock frequency, small die size, and low power consumption and methods of stabilizing the same against drift.

BACKGROUND OF THE INVENTION

Conventional high-speed analog-to-digital converters ("ADCs") commonly employ a full flash architecture in which the analog-to-digital conversion is done in parallel by using approximately $2^n$ voltage comparators. FIG. 1 illustrates a conventional full flash ADC 100 including an input voltage 110, a reference voltage 112, a number of resistors, of which resistor 114 is representative, a number of conventional comparators, of which comparator 116 is representative, and a conventional decoder 118 that produces a multi-bit digital output 120.

As is well known in the art, input voltage 110 is applied simultaneously to each comparator 116. In addition, fractional portions of the reference voltage 112 are applied to the comparators 116 by dividing the reference voltage 112 in equal increments (or thresholds) by the resistors 114. The output of each comparator 116 is applied to the decoder 118 which decodes such received inputs into a multi-bit digital output 120 representative of the input voltage 110. Although a single-ended structure is shown in FIG. 1 and throughout this discussion, in practice a fully differential structure can be used.

ADCs for operation at high frequencies, however, require a large amount of integrated circuit area and have high power consumption, and all such requirements increase as the number of bit of resolution of the ADC increases. For example, a 6-bit full flash ADC requires about $2^6$=64 voltage comparators. In a CMOS implementation of a full flash ADC, these comparators are normally implemented using conventional auto-zero voltage comparators. An auto-zero voltage comparator, however, requires a two-phase clock for auto-zeroing in the first phase, and for actual signal comparison in the second phase. Unfortunately, such two-phase design limits the maximum achievable operating frequency to a factor of two lower than otherwise possible, other factors being equal, if non-auto zero voltage comparators are employed.

Non-auto zero voltage comparators, such as those used in full flash ADCs implemented in Bipolar or BiCMOS integrated circuit processes, are generally not practical for implementation in standard CMOS processes because device mismatches (e.g., input offset voltage) of CMOS voltage comparators tend to be much higher than for Bipolar equivalents. CMOS voltage comparators with low input offset voltage can usually only be obtained using complex circuitry that requires large integrated circuit area with associated higher power consumption, and generally lower conversion speed.

Therefore, it is desirable to provide a high resolution ADC that has small die size and low power consumption, and that avoids the effects of operational mismatches.

SUMMARY OF THE INVENTION

Accordingly, the full flash ADC of the present invention includes a plurality of comparators and a referencing scheme that effectively cancels out the input offset voltages of the comparators. The input offset voltage of each of the plurality of comparators is obtained by performing a self calibration process on the ADC during, for example, power up. Then, the input offset voltage for each of the comparators is stored in a look-up table. When the ADC is used, the look-up table provides offset correction to the normal reference voltages for each comparator.

In one embodiment of the present invention, the offset look-up table controls a digital-to-analog converter ("DAC"). In addition, a track/hold ("T/H"), circuit, also known as a sample/hold circuit, is connected to a reference input of each comparator. The T/H circuit receives its input from the DAC and holds received voltages for application to its associated comparator as a first or reference input. Each comparator receives the analog input voltage as its second input and the outputs of the comparators are supplied a conventional decoder.

The look up table, in combination with a T/H controller and the DAC, operates each T/H circuit to provide a voltage equivalent to the reference voltage corrected by the input offset voltage of the associated comparator. After the correct reference voltages are loaded into the T/H circuits, the analog input signal is applied to all of the comparators. Each comparator produces an output signal indicating whether the magnitude of the input signal is, for example, greater than the magnitude of the corrected reference voltage. The decoder receives such comparator outputs and decodes the outputs into a representative multi-bit digital output signal.

DETAILED DESCRIPTION OF THE PREFERRED EMBODIMENTS

Figure 1:
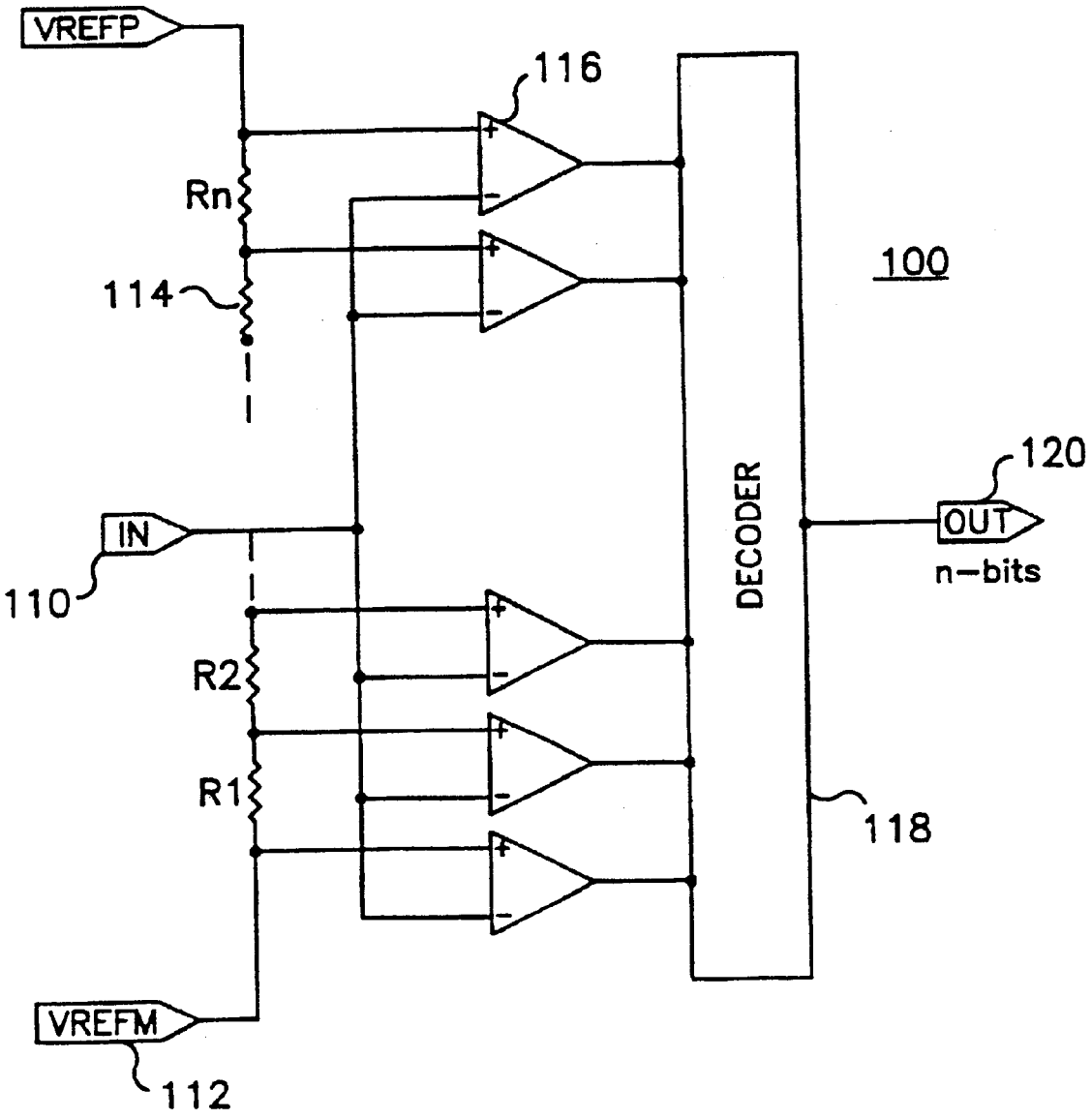
FIGURE 1 (PRIOR ART)
FIG. 1 is a block diagram of a conventional full flash ADC.
Figure 2:
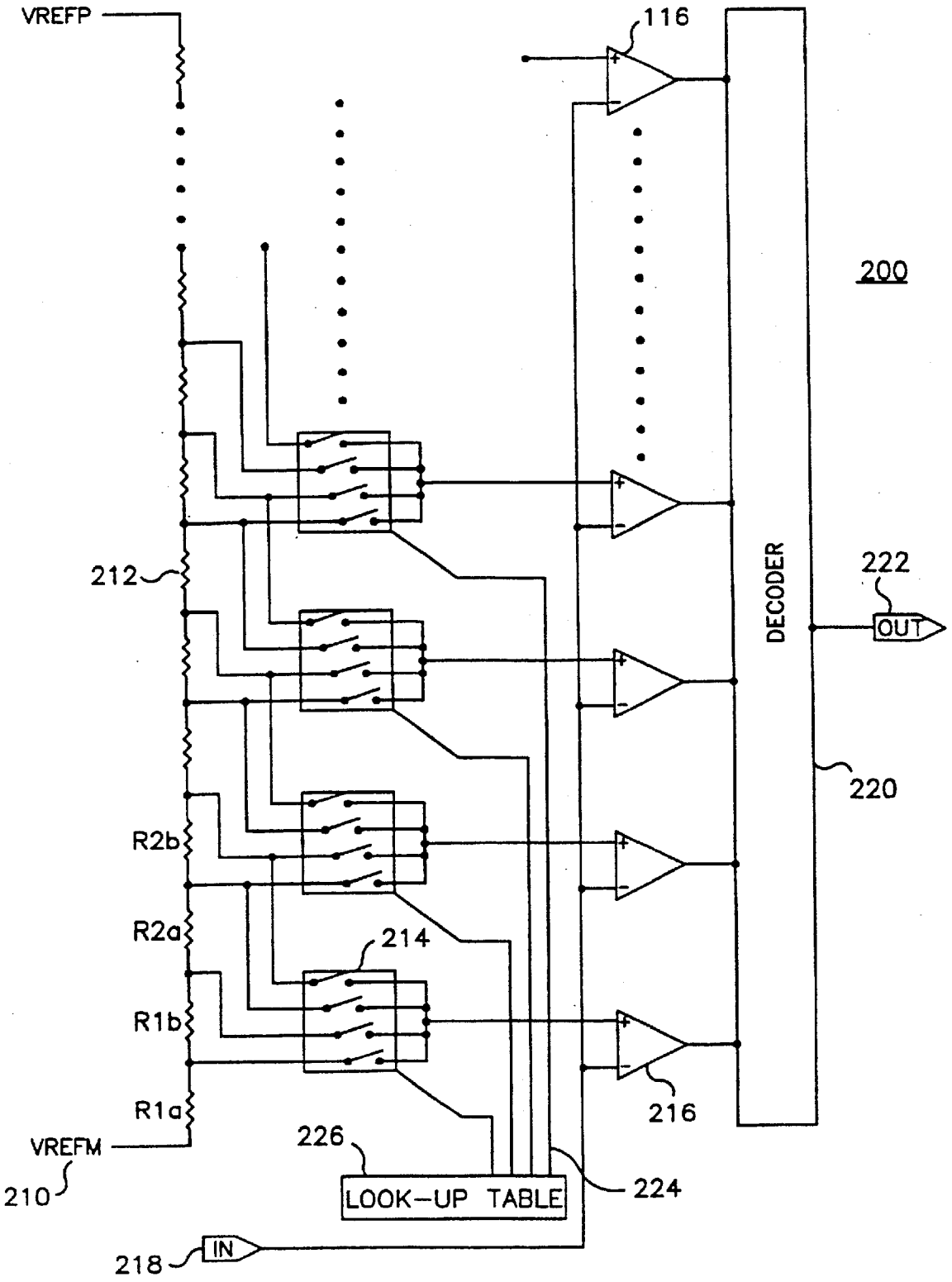
FIG. 2 is a block diagram of a full flash ADC having four choices of reference voltage per comparator.

FIG. 2 is a block diagram of a calibrated analog-to-digital converter ("ADC") 200 having four choices of reference voltage per comparator derived from a reference voltage input 210. A number of resistors, of which resistor 212 is exemplary, are coupled in series to the reference voltage 210. A number of switching circuits, of which switching circuit 214 is exemplary, are coupled to junctions of resistors 212 to apply selected ones of four different voltages to a reference input of each comparator 216. The output of each switching circuit 214 is coupled to an associated comparator, of which comparator 216 is exemplary. In addition, each comparator 216 receives an input voltage appearing on input 218. A conventional decoder 220 receives the outputs of the comparators 216 and produces a digital output 222 representation of the voltage appearing on input 218.

The embodiment of a full flash ADC 200 illustrated in FIG. 2 includes an array of comparator 216 arranged to receive associated reference voltages selected via the switching circuits 214. The resistors 212 divide the reference voltage into a plurality of thresholds with incremental variations available about each threshold. Each switching circuit 214 has four switches to couple a different voltage threshold (that is selectable via commands sent over a switching network circuit 224) to the associated comparator reference input. Accordingly, each switch 214 can provide one of four different reference voltages to a reference input of its respective comparator 216.

The offset voltage for each comparator 216 is obtained by a self-calibration process performed before the ADC 200 begins operating. For example, upon initial factory test or upon each power up of the circuit, a zero input voltage at input 218 should yield a zero digital output indication at the output 222 of decoder 220. Specifically, each comparator 216 is activated in sequence with a known input voltage on one input and with selectable increments around a desired threshold reference value available to apply to the other input of each comparator in succession. Of course, other comparators 216 than the one being calibrated can be disabled to avoid adverse effects on decoder 220. Any deviation between known inputs applied to a comparator that produces an output therefrom may be compensated by alternative settings of switching circuits 214 to provide an offset correcting reference voltage to the comparator. In this way, each comparator 216 provides an output to the decoder 220 for a known input voltage when compared with its corrected reference input voltage during normal operation. The settings of the switching circuits 214 that are required to so calibrate each comparator against its individual offset errors may be stored in look-up table 226 for recall during normal operation on unknown voltages applied to input 218. Digital values describing the settings of switching circuits 214 to provide the proper offset voltages for the comparators 216 are stored in entries of a look-up table 226 which may be a segment of random access memory ("RAM") or other storage device. During normal operation of the ADC 200, the look-up table 226 provides the digital values needed to select a reference voltage that compensates for the inherent offset voltage of each comparator 216. The selected reference voltage for each comparator 216 will be somewhat different from the ideal reference voltage at each threshold level per comparator 216. Of course, the greater the comparator 216 input offset voltage, the greater the difference between the ideal reference voltage and the corrected reference voltage as determined by the settings of the switching circuits 214.

In the ADC 200 of FIG. 2, each of the switching circuits 214 must be connected to the look-up table 226. Thus, the number of signal lines needed to control the switching circuits 224 is generally impractical for an ADC 200 with more than 4 or 5 bits of accuracy. For example, a 6-bit ADC with eight choices of reference voltages for each comparator would require approximately $2^6*8=512$ control lines as an impractical number of control lines with which to operate.

Figure 3:
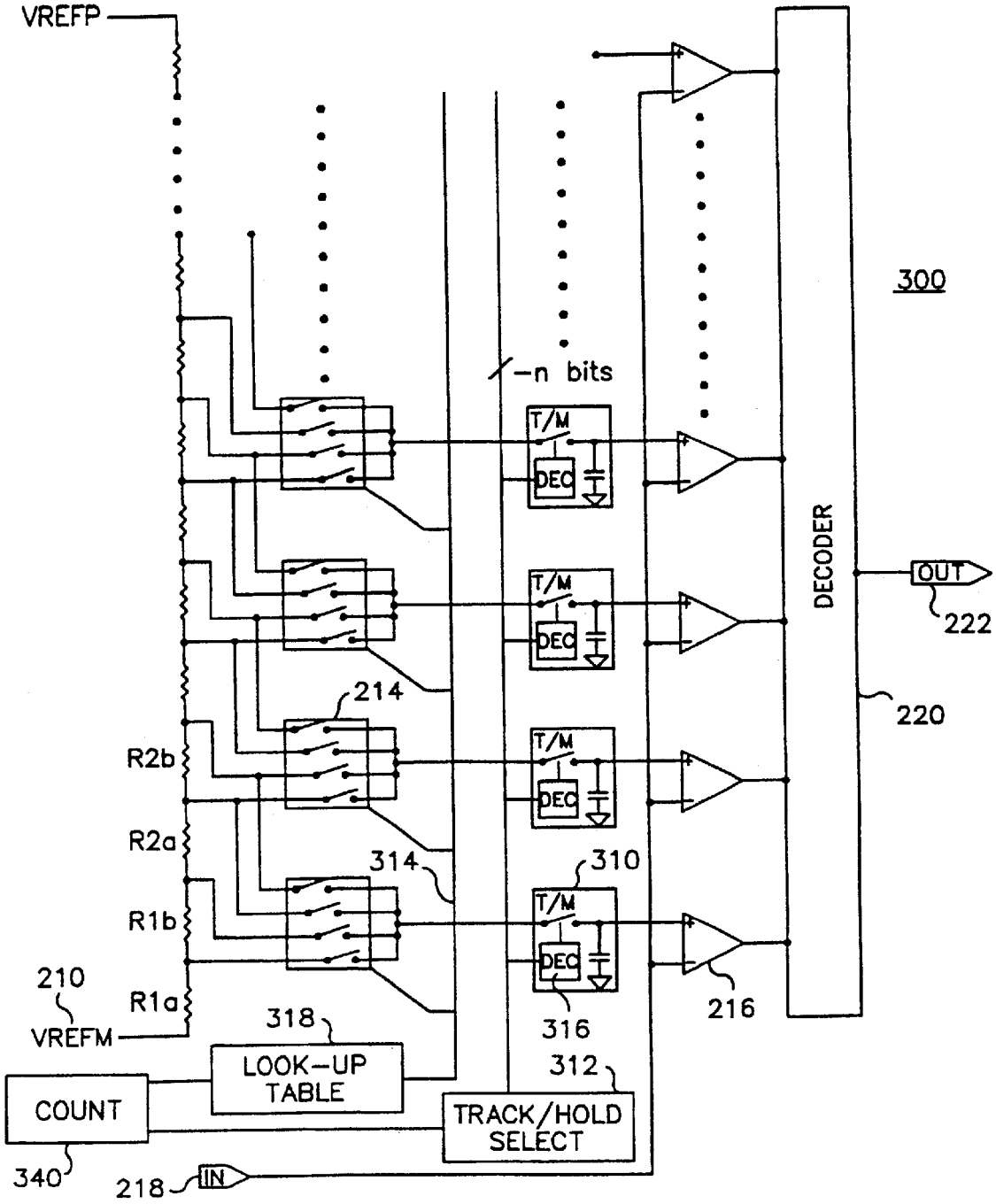
FIG. 3 is a block diagram of a full flash ADC having a reference track/hold circuit for each comparator.

The number of control lines are reduced in the embodiment of an ADC illustrated in FIG. 3. In this embodiment, the full flash ADC 300 includes a reference track/hold circuit 310 for each comparator. FIG. 3 shows many of the components shown in FIG. 2, including reference voltage 210, the resistors 212 in a divider circuit, the switching circuits 214, the comparators 216, voltage input 218, and decoder 220 with digital output 222. In addition, FIG. 3 illustrates a track/hold, or sample/hold, circuit, of which circuit 310 is exemplary, connected between each reference switching circuit 214 and its respective comparator 216. Each track/hold circuit 310 includes a conventional decoder 316 controlled by a conventional track/hold selection circuit 312. A particular track/hold circuit 310 can be selected and activated by a digital signal from the track/hold selection circuit 312. In addition, the switching circuits 214 are controlled from look up table 318 in a similar manner as previously described.

Before use, the ADC 300 is calibrated in the same manner as previously described with reference to FIG. 2. Again, digital values describing the input offset voltages of the comparators 216 are stored in entries of a look-up table 318 that thus stores digital values which determine the switch settings in switching circuits 214 required to select a reference voltage that compensates for the input offset voltage of the corresponding comparator 216. Then, a counter 340 connected to control access to entries in the look-up table 318 and to control the track/hold selection 312 thus causes the corresponding track/hold circuit 310 to load the corrected reference voltages for all comparators 216 in succession. In this manner, the look-up table 318 sequentially loads a corrected reference voltage into each track/hold circuit 310 that compensates for the input offset voltage of the corresponding comparator 216.

The ADC 300 illustrated in FIG. 3 allows the comparator reference voltage 210 to be isolated from the switching network 214. Accordingly, the control lines for the reference switching circuit 314 can be shared. Thus, the number of control lines 314 needed for the switching circuits 214 is significantly reduced from the number of control lines requested by the embodiment of ADC 200 illustrated in FIG. 2.

Figure 4:
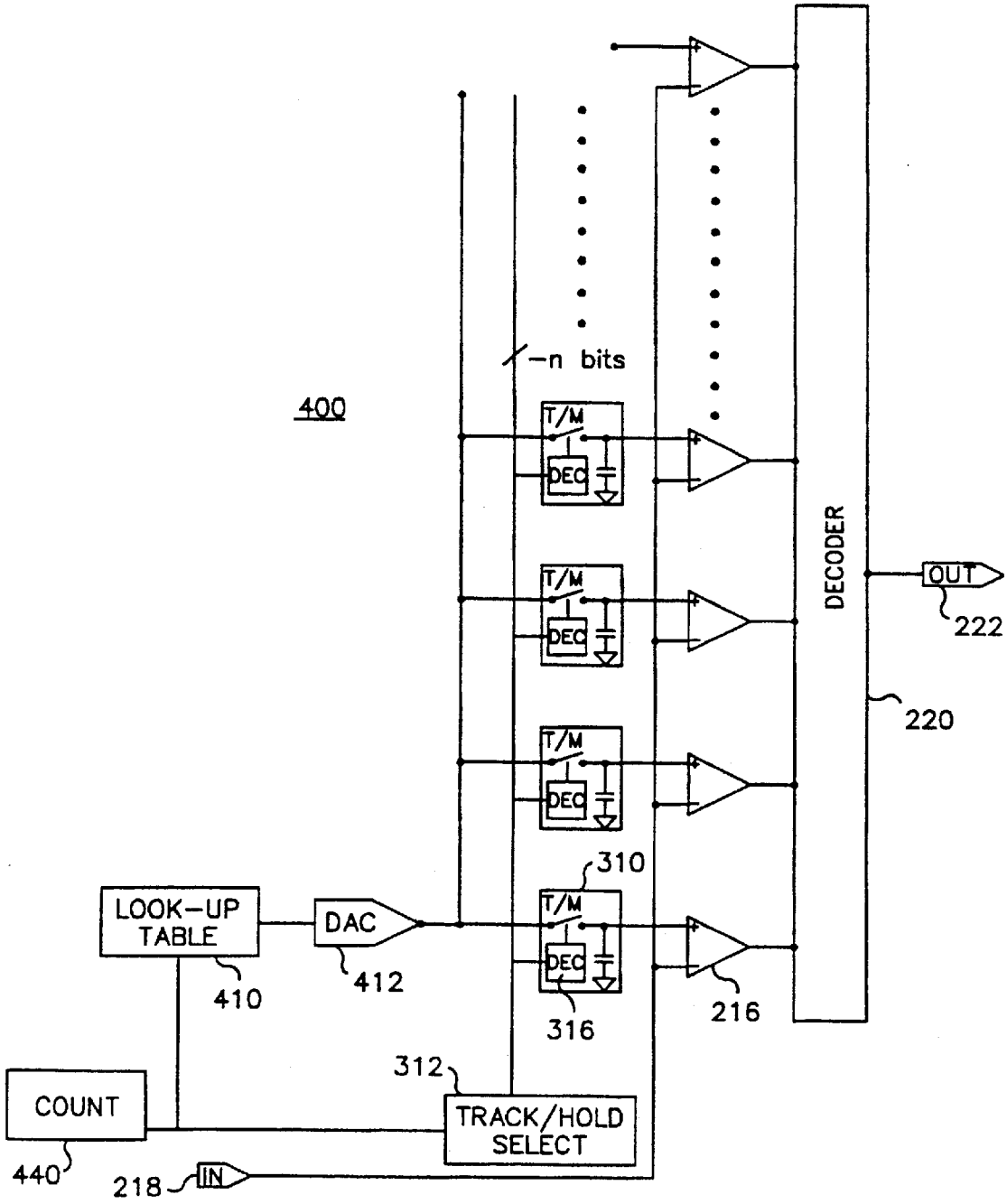
FIG. 4 is a block diagram of a calibrated full flash ADC having a reference track/hold circuit for each comparator and a digital to analog converter connected to supply correct reference voltages to each track/hold circuit.

Referring now to the block diagram of FIG. 4, there is shown a calibrated full flash ADC 400 according to another embodiment of the present invention. This embodiment similarly includes comparators 216, the voltage input 218, the decoder 220 which produces the digital output 222, the track/hold circuits 310 including the track/hold decoders 316, and the track/hold select circuit 312, all operable in similar manner as previously described. In addition, FIG. 4 shows a look-up table 410 and a digital to analog converter (DAC) 412 arranged to supply the output of the DAC 412 in turn to each of the track/hold circuits 310 under control of the counter 440.

The ADC 400 is initially calibrated prior to normal operation on input signals appearing on input 218. Specifically, the ideal or target reference voltage is supplied to a comparator for comparison with a known input voltage, and the reference voltage may be altered up or down from the target value in order to compensate for any offset required to activate or trigger the comparator 216 to supply an output to the decoder 220. Such compensating value of reference voltage for each comparator is stored as a representative digital value in the look-up table 410 for subsequent retrieval and conversion in the DAC 412 to the corresponding compensating reference voltage required by each comparator 216 during normal operation. Operation in this manner provides wider range of values of analog corrected reference voltages for the plural number of comparators required.

The calibrated reference voltages for each comparator 216 thus produced are stored digitally as entries in the look-up table 410. In operation, entries in the look-up table 410 are supplied sequentially under control of counter 440 as digital values to the DAC 412 which supplies the corresponding analog value of corrected reference voltage to the track/hold circuits 310 which load the respective corrected reference voltage into each track/hold circuit 310 that is activated by the track/hold selection circuit 312 under control of counter 440. Only one DAC 412 is needed as only one track/hold circuit 310 is activated at any given time. Of course, multiple DACs can be used if more than one track/hold circuits 310 is to be activated at a time. Due to leakage, the voltages at the outputs of the track/hold circuits 310 may drift over time. Accordingly, the track/hold circuits 310 and the entries in the look-up table 410,412 may be re-calibrated, for example, in a manner as previous described when necessary to update or refresh the calibrated reference voltages at the outputs of the track/hold circuits 310.

What is claimed is:

1. An analog to digital converter for converting an analog input signal to a representative digital output, the analog to digital converter comprising:

a memory holding a plurality of digital values, representing reference voltages;

a digital to analog converter connected to receive selected ones of the plurality of digital values from the memory for producing therefrom corresponding reference voltages;

a plurality of selectable track/hold circuits receiving and holding the reference voltages produced by the digital to analog converter for selecting particular track/hold circuits to receive particular reference voltages;

a plurality of comparators, each comparator coupled to a track/hold circuit and having an output and having a first input coupled to receive the reference voltage held by its corresponding track/hold circuit, and a second input coupled to receive the analog input signal; and a decoder receiving the outputs from the plurality of comparators for producing the digital output representative of the analog input signal.

2. The converter of claim 1, wherein the memory holds the plurality of digital values in a look-up table.

3. The converter of claim 1, wherein each comparator produces a signal indicating whether the magnitude of the analog input signal is greater than the reference voltage.

4. The converter of claim 1, wherein each reference voltage comprises:

a first voltage component representing an input offset voltage of a comparator; and a second voltage component representing a voltage threshold of the comparator.

5. The converter of claim 4, wherein the voltage threshold is determined by a number of bits in the representative digital output.

6. The converter of claim 1, wherein the decoder produces the digital output as a multi-bit digital output.

7. An analog to digital converter for converting an analog input voltage into a representative digital output, the converter comprising:

circuitry providing a plurality of reference voltages;

a plurality of track/hold circuits selectively receiving a particular one of the plurality of reference voltages and producing the received reference voltage on an output;

a plurality of comparators, each comparator associated with a track/hold circuit and receiving the output of its associated track/hold circuit as a first input and the analog input voltage as a second input and producing a signal indicating whether a magnitude of the second input is greater than a magnitude of the first input on an output; and a decoder receiving the output of each comparator and producing the representative digital output.

8. The converter of claim 7, wherein the circuitry providing a plurality of reference voltages comprises:

a memory producing digital representations of the plurality of reference voltages; and a digital to analog converter electronically coupled to the memory producing analog reference voltages represented by the produced digital representations and selectively coupled to the plurality of track/hold circuits.

9. The converter of claim 8, wherein the memory holds the digital representations of the plurality of reference voltages in a look-up table.

10. The converter of claim 7, wherein the circuitry providing a plurality of reference voltages comprises:

a plurality of resistors serially coupled to a reference source for defining a plurality of reference voltages between the resistors.

11. The converter of claim 10, wherein each of the plurality of track/hold circuits is selectively coupled to different reference voltages.

12. The converter of claim 11, further comprising:

a plurality of switches, each switch disposed to selectively couple particular reference voltages to the track/hold circuit.

13. A method of converting an analog input signal into a representative digital output signal using a plurality of comparators having first and second inputs, the method comprising the steps of:

calibrating the plurality of comparators to produce calibration reference voltages, each calibration reference voltage associated with a particular comparator;

applying each of the calibration reference voltages to the first input of the comparator with which the calibration reference voltage is associated;

applying the analog input signal to the second inputs of each of the plurality of comparators during application of the calibration reference voltages; and decoding outputs of the particular ones of the plurality of comparators to produce the representative digital output signal.

14. The method of claim 13, wherein applying each of the calibration reference voltages comprises the steps of:

selecting a track/hold circuit associated with a particular comparator;

retrieving from storage the calibration reference voltage associated with the particular comparator; and applying the retrieved calibrated reference voltage to the selected track/hold circuit.

15. The method of claim 14, wherein a digital representation of the calibration reference voltage is stored, and the retrieving step further comprises the step of:

converting the stored digital representation of the calibration reference voltage into an analog calibration reference voltage.

16. The method of claim 14, wherein the calibration reference voltages is stored in a look-up table.

17. The method of claim 14, further comprising the step of:

refreshing the selected track/hold circuit with the retrieved calibration reference voltage in order to compensate for drift.

18. The method of claim 13, wherein the calibrating step comprises the steps of:

measuring an input offset voltage of each of the plurality of comparators to produce a plurality of input offset voltages;

dividing a reference voltage into a plurality of threshold voltages; and combining selected ones of the plurality of threshold voltages with selected ones of the plurality of input offset voltages to produce calibration reference voltages.

*19. An analog to digital converter for converting an analog input signal to a representative digital output, the analog to digital converter comprising:*

*a memory to store a plurality of digital values, representing reference voltages;*

*structure providing a plurality of reference voltages;*

*a plurality of selectors, wherein each of said plurality of selectors is responsive to a respective one of the plurality of digital values to select a corresponding one of the plurality of reference voltages; and*

*a plurality of comparators, each of said plurality of comparators being responsive to a respective one of said plurality of selectors and being in communication with the analog input signal.*

*20. The converter of claim 19, further comprising a decoder responsive to said plurality of comparators.*

*21. The converter of claim 20, wherein an output of said decoder comprises a multi-bit digital output.*

*22. The converter of claim 19, further comprising a resistor arrangement to generate the plurality of reference voltage.*

*23. The converter of claim 19, wherein said memory comprises a look-up table.*

*24. The converter of claim 19, further comprising a plurality of sample and hold circuits arranged between respective ones of said plurality of selectors and said plurality of comparators.*

*25. An analog to digital converter for converting an analog input signal to a representative digital output, the analog to digital converter comprising:*

*memory means for storing a plurality of digital values, representing reference voltages;*

*a plurality of reference voltage means for providing respective reference voltages;*

*a plurality of selecting means wherein each of said plurality of selecting means is responsive to a respective one of the plurality of digital values for selecting a corresponding one of the plurality of reference voltages; and*

*a plurality of comparator means, each of said plurality of comparator means being responsive to a respective one of said plurality of selecting means and being in communication with the analog input signal.*

*26. The converter of claim 25, further comprising decoder means for decoding outputs of said plurality of comparator means.*

*27. The converter of claim 26, wherein an output of said decoder means comprises a multi-bit digital output.*

*28. The converter of claim 25, further comprising a resistor means for generating the plurality of reference voltages.*

*29. The converter of claim 25, wherein said memory means comprises a look-up table.*

*30. The converter of claim 25, further comprising a plurality of sample and hold means arranged between respective ones of said plurality of selectors and said plurality of comparators for storing a corresponding one of the reference voltages.*

*31. A method for converting an analog input signal to a representative digital output, comprising the steps of:*

*(a) storing a plurality of digital values, representing reference voltages;*

*(b) providing a plurality of reference voltages;*

*(c) selecting corresponding ones of the plurality of reference voltages in accordance with the digital values stored in step (a); and*

*(d) comparing the corresponding ones of the plurality of reference voltages selected in step (c) with the input signal.*

*32. The converter of claim 31, further comprising the step of:*

*(e) decoding the results of step (d).*

*33. The converter of claim 32, wherein an output of step (e) comprises a multi-bit digital output.*

*34. The converter of claim 32, further comprising the step of:*

*(f) storing the corresponding ones of the plurality of reference voltages selected in step (c), and*

*wherein step (d) compares the results of step (f) with the input signal.*

*35. An analog to digital converter for converting an analog input signal to a representative digital output, the analog to digital converter comprising:*

*structure providing a plurality of capacitances to store a plurality of reference voltages;*

*a plurality of comparators, each of said plurality of comparators being responsive to a respective one of said plurality of capacitances and being in communication with the analog input signal;*

*a decoder responsive to said plurality of comparators; and*

*a recalibration circuit to refresh each of said plurality of capacitances to minimize drift.*

*36. An analog to digital converter for converting an analog input signal to a representative digital output, the analog to digital converter comprising:*

*structure providing a plurality of capacitances to store a plurality of reference voltages;*

*a plurality of comparators, each of said plurality of comparators being responsive to a respective one of said plurality of capacitances and being in communication with the analog input signal;*

*a decoder responsive to said plurality of comparators; and*

*a recalibration circuit to refresh each of said plurality of capacitances to minimize leakage thereof.*

*37. An analog to digital converter for converting an analog input signal to a representative digital output, the analog to digital converter comprising:*

*a plurality of capacitance means for storing a plurality of reference voltages;*

*a plurality of comparator means, each of said plurality of comparator means for comparing a respective one of said plurality of capacitance means to the analog input signal;*

*decoder means for decoding outputs of said plurality of comparator means; and*

*recalibration means for refreshing each of said plurality of capacitance means to minimize drift.*

*38. An analog to digital converter for converting an analog input signal to a representative digital output, the analog to digital converter comprising:*

*a plurality of capacitance means for storing a plurality of reference voltages;*

*a plurality of comparator means, each of said plurality of comparator means for comparing a respective one of said plurality of capacitance means to the analog input signal;*

*decoder means for decoding outputs of said plurality of comparator means; and*

*recalibration means for refreshing each of said plurality of capacitance means to minimize leakage thereof.*

*39. A method for converting an analog input signal to a representative digital output, the analog to digital converter comprising:*

(*a*) *storing a plurality of reference voltages in respective capacitnaces;*

(*b*) *comparing a respective capacitance to the analog input signal;*

(*c*) *decoding the results of step* (*b*)*; and*

(*d*) *recalibrating each of said plurality of capacitances to minimize drift.*

*40. A method for converting an analog input signal to a representative digital output, the analog to digital converter comprising:*

(*a*) *storing a plurality of reference voltages in respective capacitances;*

(*b*) *comparing a respective capacitance to the analog input signal;*

(*c*) *decoding the results of step* (*b*)*; and*

(*d*) *recalibrating each of said plurality of capacitances to minimize leakage thereof.*

* * * * *